(12) United States Patent
Fu et al.

(10) Patent No.: US 9,023,433 B2
(45) Date of Patent: *May 5, 2015

(54) SILSESQUIOXANE RESINS AND METHOD OF USING THEM TO FORM AN ANTIREFLECTIVE COATING

(75) Inventors: Peng-Fei Fu, Midland, MI (US); Eric Scott Moyer, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 738 days.

This patent is subject to a terminal disclaimer.

(21) Appl. No.: 12/811,224

(22) PCT Filed: Nov. 18, 2008

(86) PCT No.: PCT/US2008/083849

§ 371 (c)(1),
(2), (4) Date: Jun. 30, 2010

(87) PCT Pub. No.: WO2009/091440

PCT Pub. Date: Jul. 23, 2009

(65) Prior Publication Data

US 2010/0279025 A1    Nov. 4, 2010

Related U.S. Application Data

(60) Provisional application No. 61/021,097, filed on Jan. 15, 2008.

(51) Int. Cl.

| | | |
|---|---|---|
| C08F 2/48 | (2006.01) | |
| C08K 5/5419 | (2006.01) | |
| C08G 77/04 | (2006.01) | |
| C09D 183/04 | (2006.01) | |
| G03F 7/075 | (2006.01) | |
| G03F 7/09 | (2006.01) | |
| C08G 77/12 | (2006.01) | |
| C08G 77/14 | (2006.01) | |
| C08G 77/20 | (2006.01) | |
| C08G 77/00 | (2006.01) | |

(52) U.S. Cl.
CPC ............. C08K 5/5419 (2013.01); C08G 77/04 (2013.01); C08G 77/045 (2013.01); C08G 77/12 (2013.01); C08G 77/14 (2013.01); C08G 77/20 (2013.01); C08G 77/70 (2013.01); C09D 183/04 (2013.01); G02B 1/111 (2013.01); G03F 7/0752 (2013.01); G03F 7/091 (2013.01)

(58) Field of Classification Search
CPC .......... C08F 2/48; C08F 2/50; C08G 77/045; C08G 77/12; C08G 77/14; C08G 77/16; C08G 77/18; C09D 183/04; C09D 183/06; C03F 7/162
USPC .......... 427/372.2, 508, 515, 58, 387
See application file for complete search history.

(56) References Cited

U.S. PATENT DOCUMENTS

| | | |
|---|---|---|
| 4,587,138 A | 5/1986 | Yau et al. |
| 5,010,159 A | 4/1991 | Bank et al. |
| 5,100,503 A | 3/1992 | Allman et al. |
| 5,210,168 A | 5/1993 | Bergstrom et al. |
| 5,412,053 A | 5/1995 | Lichtenhan et al. |
| 5,422,223 A | 6/1995 | Sachdev et al. |
| 5,441,765 A | 8/1995 | Ballance et al. |
| 5,484,867 A | 1/1996 | Lichtenhan et al. |
| 5,589,562 A | 12/1996 | Lichtenhan et al. |
| 5,691,396 A | 11/1997 | Takemura et al. |
| 5,708,099 A | 1/1998 | Kushibiki et al. |
| 5,762,697 A | 6/1998 | Sakamoto et al. |
| 5,891,529 A | 4/1999 | Harkness et al. |
| 6,057,239 A | 5/2000 | Wang et al. |
| 6,087,064 A | 7/2000 | Lin et al. |
| 6,143,855 A | 11/2000 | Hacker et al. |
| 6,156,640 A | 12/2000 | Tsai et al. |
| 6,177,143 B1 | 1/2001 | Treadwell et al. |
| 6,268,457 B1 | 7/2001 | Kennedy et al. |
| 6,281,285 B1 | 8/2001 | Becker et al. |
| 6,329,118 B1 | 12/2001 | Hussein et al. |
| 6,340,734 B1 | 1/2002 | Lin et al. |
| 6,344,284 B1 | 2/2002 | Chou |
| 6,359,096 B1 | 3/2002 | Zhong et al. |
| 6,365,765 B1 | 4/2002 | Baldwin et al. |

(Continued)

FOREIGN PATENT DOCUMENTS

| | | |
|---|---|---|
| EP | 1197511 | 4/2002 |
| EP | 1197998 | 4/2002 |

(Continued)

OTHER PUBLICATIONS

Drylie, Ewan et al., Synthesis and Crystal Structures of Bromo- and Ester-Functionalised Polyhedral Silsesquioxanes, Polyhedron, Mar. 6, 2006, vol. 25, pp. 853-858.

(Continued)

*Primary Examiner* — Elena T Lightfoot

(74) *Attorney, Agent, or Firm* — Howard & Howard Attorneys PLLC

(57) ABSTRACT

A silsesquioxane resins useful in antireflective coatings wherein the silsesquioxane resin has the formula

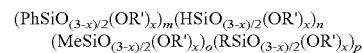

and a method of forming an antireflective coating on an electronic device comprising applying to an electronic device an antireflective coating composition comprising the silsesquioxane resin and a solvent, and removing the solvent and curing the silsesquioxane resin to form an antireflective coating on the electronic device.

7 Claims, No Drawings

(56) References Cited

U.S. PATENT DOCUMENTS

| | | | |
|---|---|---|---|
| 6,368,400 B1 | 4/2002 | Baldwin et al. | |
| 6,395,397 B2 | 5/2002 | Hong et al. | |
| 6,420,084 B1 | 7/2002 | Angelopoulos et al. | |
| 6,420,088 B1 | 7/2002 | Angelopoulos et al. | |
| 6,424,039 B2 | 7/2002 | Wang et al. | |
| 6,461,955 B1 | 10/2002 | Tsu et al. | |
| 6,503,692 B2 | 1/2003 | Angelopoulos et al. | |
| 6,506,497 B1 | 1/2003 | Kennedy et al. | |
| 6,509,259 B1 | 1/2003 | Wang et al. | |
| 6,515,073 B2 | 2/2003 | Sakamoto et al. | |
| 6,576,681 B2 | 6/2003 | Zampini et al. | |
| 6,589,711 B1 | 7/2003 | Subramanian et al. | |
| 6,589,862 B2 | 7/2003 | Wang et al. | |
| 6,596,405 B2 | 7/2003 | Zampini et al. | |
| 6,599,951 B2 | 7/2003 | Zampini et al. | |
| 6,605,362 B2 | 8/2003 | Baldwin et al. | |
| 6,730,454 B2 | 5/2004 | Pfeiffer et al. | |
| 6,746,530 B2 | 6/2004 | Wang | |
| 6,824,879 B2 | 11/2004 | Baldwin et al. | |
| 6,924,346 B2 | 8/2005 | Boisvert et al. | |
| 6,956,097 B2 | 10/2005 | Kennedy et al. | |
| 6,969,753 B2 | 11/2005 | Baldwin et al. | |
| 6,982,006 B1 | 1/2006 | Boyers et al. | |
| 7,012,125 B2 | 3/2006 | Kennedy et al. | |
| 7,202,013 B2 | 4/2007 | Ogihara et al. | |
| 7,294,732 B2 | 11/2007 | Ohno et al. | |
| 7,368,173 B2 | 5/2008 | Zhong et al. | |
| 7,393,911 B2 | 7/2008 | Noda | |
| 7,756,384 B2 | 7/2010 | Fu et al. | |
| 8,115,902 B2 | 2/2012 | Shiraishi | |
| 2001/0036998 A1 | 11/2001 | Sakamoto et al. | |
| 2002/0025495 A1 | 2/2002 | Ogata et al. | |
| 2002/0042020 A1 | 4/2002 | Gallagher et al. | |
| 2002/0055000 A1 | 5/2002 | Kennedy et al. | |
| 2002/0065331 A1 | 5/2002 | Zampini et al. | |
| 2002/0095018 A1 | 7/2002 | Baldwin et al. | |
| 2002/0128388 A1 | 9/2002 | Kennedy et al. | |
| 2002/0142586 A1* | 10/2002 | Shiota | 438/633 |
| 2002/0187422 A1 | 12/2002 | Angelopoulos et al. | |
| 2002/0195419 A1 | 12/2002 | Pavelchek | |
| 2002/0198269 A1 | 12/2002 | Zampini et al. | |
| 2003/0022953 A1 | 1/2003 | Zampini et al. | |
| 2003/0031789 A1 | 2/2003 | Bedwell et al. | |
| 2003/0087102 A1* | 5/2003 | Yamaya et al. | 428/419 |
| 2003/0120018 A1 | 6/2003 | Baldwin et al. | |
| 2003/0176614 A1 | 9/2003 | Hacker et al. | |
| 2003/0199659 A1 | 10/2003 | Baldwin et al. | |
| 2003/0209515 A1 | 11/2003 | Pavelchek | |
| 2005/0245717 A1 | 11/2005 | Kennedy et al. | |
| 2005/0282090 A1 | 12/2005 | Hirayama et al. | |
| 2005/0288468 A1 | 12/2005 | Ohno et al. | |
| 2006/0021964 A1 | 2/2006 | Hirayama et al. | |
| 2006/0089478 A1 | 4/2006 | Noda | |
| 2006/0269724 A1 | 11/2006 | Ohashi et al. | |
| 2007/0022909 A1 | 2/2007 | Kennedy et al. | |
| 2007/0025678 A1 | 2/2007 | Kushibiki et al. | |
| 2007/0212886 A1* | 9/2007 | Uh et al. | 438/706 |
| 2007/0298349 A1 | 12/2007 | Zhang et al. | |
| 2008/0014335 A1 | 1/2008 | Fu et al. | |
| 2008/0318436 A1 | 12/2008 | Fu et al. | |
| 2010/0093969 A1 | 4/2010 | Zhang et al. | |

FOREIGN PATENT DOCUMENTS

| | | |
|---|---|---|
| JP | 06-56560 | 3/1994 |
| JP | 09221630 | 8/1997 |
| JP | 2002338690 | 11/2002 |
| JP | 2002356617 | 12/2002 |
| WO | WO 00/77575 | 12/2000 |
| WO | WO 02/06402 | 1/2002 |
| WO | WO 03/044077 | 5/2003 |
| WO | WO 03/044078 | 5/2003 |
| WO | WO 03/044079 | 5/2003 |
| WO | WO 03/044600 | 5/2003 |
| WO | WO 03/089992 | 10/2003 |
| WO | WO 2004/007192 | 1/2004 |
| WO | WO 2004/044025 | 5/2004 |
| WO | WO 2004/046224 | 6/2004 |
| WO | WO 2004/051376 | 6/2004 |
| WO | WO 2004/090965 | 10/2004 |
| WO | WO 2004/113417 | 12/2004 |
| WO | WO 2005/005235 | 1/2005 |
| WO | WO 2005/034236 | 4/2005 |
| WO | WO 2005/034677 | 4/2005 |
| WO | WO 2005/035236 | 4/2005 |
| WO | WO 2006/019468 | 2/2006 |
| WO | WO 2006/065310 | 6/2006 |
| WO | WO 2006/065316 | 6/2006 |
| WO | WO 2006/065320 | 6/2006 |
| WO | WO 2006/065321 | 6/2006 |
| WO | WO 2007/094848 | 8/2007 |
| WO | WO 2007/094849 | 8/2007 |
| WO | WO 2009/088600 | 7/2009 |
| WO | WO 2009/111121 | 9/2009 |
| WO | WO 2009/111122 | 9/2009 |
| WO | WO 2010/068336 | 6/2010 |

OTHER PUBLICATIONS

Feher, Frank J. et al. A General Strategy for Synthesizing Cubeoctameric Silsesquioxanes Containing Polymerizable Functional Groups. Main Group Chemistry. May 1998, vol. 2, Issue 3, pp. 169-181, ISSN 1024-1221.

J. Am. Chem. Soc. 1991, 113, 4303 by J. F. Cameron and J.M.J. Frechet.

Kennedy et al., An Anthraacene-Organosiloxane Spin on Antireflective Coating for KrF Lithography, Advances in Resist Technology and Processing XX, Theodore H. Fedynshyn, Editor, Proceedings of SPIE vol. 5039, 2003, 144-151.

Kennedy et al., Organosiloxane based Bottom Antireflective Coatings for 193nm Lithography, Advances in Resist Technology and Processing XX, Theodore H. Fedynyshyn, Editor, Proceedings of SPIE vol. 5039, 2003, 929-939.

Polym. Eng. Sci 1992, 32, 1462 by J. V. Crivello.

Rahimian, Kamyar et al., Soluble, High Molecular Weight Polysilsesquioxanes with Carboxylate Functionalities, Macromolecules, Mar. 26, 2002, vol. 35, pp. 2452-2454.

Schiavone et al., SiON based antireflective coating for 193nm lithography, Part of the SPIE Conference on Advances in Resist Technology and Processing XVI, SPIE vol. 3678, Mar. 1999, 391-395.

J. Polym Sci 1999, 37, 4241by J.V. Crivello.

Xu, Hui et al., Synthesis and Characterization of Oligomeric Silsesquioxane with Pendent Carboxylic Acid Groups, European Polymer Journal, Dec. 2001, vol. 37, pp. 2397-2405.

Tsunooka et al., J. Photopolym. Sci. Technol., vol. 19, No. 1, 2006, pp. 65-71.

Ito et al., Can. J. Chem. 73: 1924-1932 (1995).

King Industries Specialty Chemicals, K-Pure® High Performance Additives for Electronic Chemical Systems (May 2006).

\* cited by examiner

SILSESQUIOXANE RESINS AND METHOD OF USING THEM TO FORM AN ANTIREFLECTIVE COATING

CROSS REFERENCE TO RELATED APPLICATIONS

This application is a U.S. national stage filing under 35 U.S.C. §371 of PCT Application No. PCT/US08/83849 filed on 18 Nov. 2008, currently pending, which claims the benefit of U.S. Provisional Patent Application No. 61/021,097 filed 15 Jan. 2008 under 35 U.S.C. §119 (e). PCT Application No. PCT/US08/83849 and U.S. Provisional Patent Application No. 61/021,097 are hereby incorporated by reference.

BACKGROUND OF THE INVENTION

With the continuing demand for smaller feature sizes in the semiconductor industry, 193 nm optical lithography has emerged very recently as the technology to produce devices with sub-100 nm features. The use of such shorter wavelength of light requires the bottom antireflective coating (BARC) to reduce the reflection on the substrate and dampen the photoresist swing cure by absorbing light that has been passed through the photoresist. Commercially available antireflective coatings (ARC) consist of both organic and inorganic materials. Typically, the inorganic ARC, which exhibit good etch resistant, is CVD based and is subject to the entire integration disadvantage of extreme topography. The organic ARC materials are applied by spin-on process and have excellent fill and planarization properties, but suffer from poor etch selectivity to organic photoresist. As a result, a material that offers the combined advantages of inorganic and organic ARC materials is highly desired.

BRIEF SUMMARY OF THE INVENTION

This invention pertains to silsesquioxane resins useful in antireflective coatings wherein the silsesquioxane resin has the formula

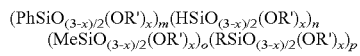

where Ph is a phenyl group, Me is a methyl group, R is selected from a reactive organic functional group or curable group, R' is hydride or a hydrocarbon group having from 1 to 4 carbon atoms, x has a value of 0, 1 or 2; m has a value of 0.01 to 0.97, n has a value of 0.01 to 0.97, o has a value of 0.01 to 0.97, p has a value of 0.01 to 0.97, and m+n+o+p≈1. When these resins are used in antireflective coatings, the coatings can be stripped at the removal stage. In addition, the presence of a hydride group in the silsesquioxane resin is essential for the desired cure properties and strip-ability as a 193 nm ARC material.

This invention also pertains to an antireflective coating (ARC) composition comprising
(i) silsesquioxane resin having the formula

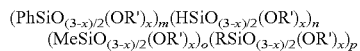

where Ph is a phenyl group Me is a methyl group, R is selected from a reactive organic functional group or curable group. R' is hydride or a hydrocarbon group having 1 to 4 carbon atoms, x has a value of 0, 1 or 2; m has a value of 0.01 to 0.97, n has a value of 0.01 to 0.97, o has a value of 0.01 to 0.97, p has a value of 0.01 to 0.97, and m+n+o+p≈1; and
(ii) a solvent.

This invention also pertains to a method of forming an antireflective coating on an electronic device comprising
(A) applying to an electronic device an ARC composition comprising
(i) silsesquioxane resin having the formula

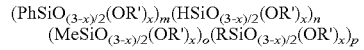

where Ph is a phenyl group Me is a methyl group, R is selected from a reactive organic functional group or curable group, R' is hydride or a hydrocarbon group having 1 to 4 carbon atoms, x has a value of 0, 1 or 2; m has a value of 0.01 to 0.97, n has a value of 0.01 to 0.97, o has a value of 0.01 to 0.97, p has a value of 0.05 to 0.95, and m+n+o+p≈1; and
(ii) a solvent, and
(B) removing the solvent and curing the silsesquioxane resin to form an antireflective coating on the electronic device.

DETAILED DESCRIPTION OF THE INVENTION

The silsesquioxane resins useful in forming the antireflective coating have the formula

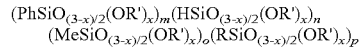

where Ph is a phenyl group Me is a methyl group, R is selected from a reactive organic functional group or curable group. R' is independently a hydride or a hydrocarbon group having 1 to 4 carbon atoms, x has a value of 0, 1 or 2; m has a value of 0.01 to 0.97, n has a value of 0.01 to 0.97, o has a value of 0.01 to 0.97, p has a value of 0.01 to 0.97, and m+n+o+p≈1. Typically m has a value of 0.02 to 0.7, alternatively 0.10 to 0.50. Typically n has a value of 0.05 to 0.90, alternatively 0.10 to 0.50. Typically o has a value of 0.05 to 0.90, alternatively 0.10 to 0.60. Typically p has a value of 0.02 to 0.20, alternatively 0.05 to 0.15.

In the resin R is a reactive organic functional group or curable group. R may be exemplified by, but not limited to alkenyl groups such at vinyl and allyl; epoxy groups such as glycidoxypropyl group and epoxycyclohexane group, acrylate groups such as methacryloxypropyl groups, acryloxypropyl, and others.

R' is independently a hydride or hydrocarbon group having 1 to 4 carbon atoms. R' may be exemplified by H, methyl, ethyl, propyl, iso-propyl, butyl and tert-butyl.

The typical method for producing the silsesquioxane resin involves the hydrolysis and condensation of the appropriate silanes. By this method it is possible that residual —OH and/or —OR' will remain in the silsesquioxane resin as a result of incomplete hydrolysis or condensation. If the total amount of units in the silsesquioxane resin containing —OR' groups, exceed 60 mole % then gellation and instability of the resin may occur. Typically the silsesquioxane resin contains less 60 mole % or units containing —OR' groups, alternatively less than 50 mole %.

The silsesquioxane resin has a weight average molecular weight (Mw) in the range of 500 to 400,000 alternatively in the range of 500 to 100,000 as determined by gel permeation chromatography employing RI detection and polystyrene standards.

The silsesquioxane resins may be produced by methods known in the art. For example, the silsesquioxane resins may be produced by the hydrolysis and condensation or a mixture of trialkoxy silanes using the methods as set forth in "Chemistry and Technology of Silicone" by Noll, Academic Press, 1968, chapter 5, p 190-245. Alternatively they may be produced by the hydrolysis and condensation of a trichlorosilanes using the methods as set forth in U.S. Pat. No. 6,281,285 to Becker et al. and U.S. Pat. No. 5,010,159 to Bank et al.

The silsesquioxane resin is typically produced in the presence of a solvent. Any suitable organic or silicone solvent that does not contain a functional group which may participate in the hydrolysis and/or condensation reaction may be used in producing the silsesquioxane resin. The solvent is generally used in an amount of 40 to 98 weight percent based on the total weight of solvent and silane reactants, alternatively 70 to 90 weight percent. The reaction may be carried out as a dual phase or single-phase system.

Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol dietheyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as propylene glycol monomethyl ether acetate (PGMEA), isobutyl isobutyrate and propyl propronate. Useful silicone solvents may be exemplified by, but not limited to cyclic siloxanes such as octamethylcyclotetrasiloxane, and decamethylcyclopentasiloxane. A single solvent may be used or a mixture of solvents may be used.

The reaction to produce the silsesquioxane resin can be carried out at any temperature so long as it does not cause significant gellation or cause curing of the silsesquioxane resin. Typically the reaction is carried out at a temperature in the range of 5° C. to 150° C., with 15° C. to 100° C. suggested.

The time to form the silsesquioxane resin is dependent upon a number of factors such as the temperature, the type and amount of silane reactants, and the amount of catalyst, if present. Typically the reaction time is from several minutes to several hours. One skilled in the art will be able to readily determine the time necessary to complete the reaction. Catalysts that may be used to facilitate the reaction include, but are not limited to, acids, such as nitric acid, sulfuric acid, hydrochloric acid, and others and bases such as potassium hydroxide, sodium hydroxide, cesium hydroxide, tetramethylammonium hydroxide and others.

Following completion of the reaction the catalyst may be optionally removed. Methods for removing the catalyst are well know in the art and would include neutralization, stripping or water washing or combinations thereof. The catalyst may negatively impact the shelf life of the silicone resin especially when in solution thus its removal is suggested.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilane routes) and solvents. Methods for removing volatiles are known in the art and include, for example, distillation.

Following the reaction to produce the silsesquioxane resin a number of optional steps may be carried out to obtain the silsesquioxane resin in the desired form. For example, the silsesquioxane resin may be recovered in solid form by removing the solvent. The method of solvent removal is not critical and numerous methods are well known in the art (e.g. distillation under heat and/or vacuum). Once the silsesquioxane resin is recovered in a solid form, the resin can be optionally re-dissolved in the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

This invention also pertains to an antireflective coating (ARC) composition comprising (i) silsesquioxane resin having the formula

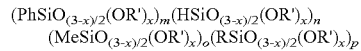

$$(\text{PhSiO}_{(3-x)/2}(\text{OR}')_x)_m(\text{HSiO}_{(3-x)/2}(\text{OR}')_x)_n$$
$$(\text{MeSiO}_{(3-x)/2}(\text{OR}')_x)_o(\text{RSiO}_{(3-x)/2}(\text{OR}')_x)_p$$

where Ph is a phenyl group Me is a methyl group, R is selected from a reactive organic functional group or curable group. R' is hydride or a hydrocarbon group having 1 to 4 carbon atoms, x has a value of 0, 1 or 2; m has a value of 0.01 to 0.97, n has a value of 0.01 to 0.97, o has a value of 0.01 to 0.97, p has a value of 0.01 to 0.97, and m+n+o+p≈1; and (ii) a solvent.

Useful solvents (ii) include, but are not limited to, 1-methoxy-2-propanol, propylene glycol monomethyl ethyl acetate and cyclohexanone, among others. The ARC composition typically comprises from about 10% to about 99.9 wt % solvent based on the total weight of the ARC composition, alternatively 80 to 95 wt %.

The ARC composition may comprise a free radical initiator or other additives to promote and improve the cure of the resin, i.e. increase the crosslinking density of the resin being cured, at elevated temperatures or under irradiation. Suitable free radical initiators include peroxides and photoinitiators such as benzoyl peroxide, dicumyl peroxide, azobisisobutyronitrile (AIBN) and others. Typically the free radical initiator is present in an amount of up to 1000 ppm, alternatively 10 to 500 ppm, based on the total weight of the ARC composition. The other additives may include, but not limited to, photo-acid and thermal-acid generators, photo-base and thermal-base generators.

The ARC composition may comprise other additives. These other additives include, but are not limited to Lewis and Bronsted acids and bases generated photochemically or thermally during the curing process, which are know in the art. Examples include TAG-2168 which contains blocked dodecylbenzene sulfonic acid in from King Industries at Norwalk, Conn. and IRGACURE 379 which is a blocked tertiary alkyl amine from Ciba specialty chemicals. Photo-acid generators are known in the art and include sulfonyldiazomethane acid generators, onium salt generators and oxime sulfonate acid generators, phosphonium salt generators, sulfonium salt generators, iodonium salt generators, iminosulfonate generators, oximesulfonate generators, disulfone generators, and o-nitrobenzyl sulfonate generators. Thermal acid generators are known in the art and include aromatic sulfonic acid salts. Examples of the thermal-acid generators (TAG) or photo-acid generators (PAG) can be found in *Polym. Eng. Sci* 1992, 32, 1462 by J. V. Crivello and *J. Am. Chem. Soc.* 1991, 113, 4303 by J. F. Cameron and J. M. J. Frechet, respectively, and are commercialized available at King industries, Norwalk, N.J. 06852.

The antireflective coating compositions are formed by mixing together the silsesquioxane resin, solvent, and optionally the free radical initiator and/or other additive. Typically the free radical initiator or other additive is added to the coating composition just prior to its use to prevent premature curing.

The antireflective coating composition is applied to an electronic device to produce a coated substrate. The solvent is removed and the silsesquioxane resin is cured to produce the antireflective coating on the electronic device.

Typically the electronic device is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

Specific methods for application of the ARC composition to the electronic device include, but are not limited to, spin-coating, dip-coating, spay-coating, flow-coating, screen-printing and others. The preferred method for application is spin coating. Typically, coating involves spinning the electronic device, at about 2000 RPM, and adding the ARC composition to the surface of the spinning electronic device.

The solvent is removed and the silsesquioxane resin is cured to form the anti-reflective coating on the electronic device. Curing generally comprises heating the coating to a sufficient temperature for a sufficient duration to lead to curing. Curing occurs when sufficient crosslinking has taken place such that the silsesquioxane resin is essentially insoluble in the solvent from which it was applied. Curing may take place for example by heating the coated electronic device at 80° C. to 450° C. for 0.1 to 60 minutes, alternatively 150° C., to 275° C. for of 0.5 to 5 minutes, alternatively 200° C. to 250° C. for 0.5 to 2 minutes. Any method of heating may be used during the curing step. For example, the coated electronic device may be placed in a quartz tube furnace, convection oven or allowed to stand on hot plates. Alternatively, the anti-reflective coating can be cured under ultraviolet irradiation in the presence of photoactive additives, such as photo-acid generator (PAG) or photo-base generators.

To protect the silsesquioxane resin of the coated composition from reactions with oxygen or carbon during curing, the curing step can be performed under an inert atmosphere. Inert atmospheres useful herein include, but are not limited to nitrogen and argon. By "inert" it is meant that the environment contain less than 50 ppm and preferably less than 10 ppm of oxygen. The pressure at which the curing and removal steps are carried out is not critical. The curing step is typically carried out at atmospheric pressure although sub or super atmospheric pressures may work also.

Once cured, the electronic device comprising the anti-reflective coating can be used in further substrate processing steps, such as photolithography. When used in photolithography, a resist image is formed over the anti-reflective coating. The process for forming the resist image comprises (a) forming a film of a resist composition on top of the anti-reflective coating; (b) image-wise exposing the resist film to radiation to produce an exposed film; and (c) developing the exposed film to produce an image. The anti-reflective coatings on the electronic device are particularly useful with resist compositions that are image-wise exposed to ultraviolet radiation having a wavelength of 157 nm to 365 nm, alternatively ultraviolet radiation having a wavelength of 157 nm or 193 nm. Once an image has been produced in the resist film, then a pattern is etched in the anti-reflective coating. Known etching materials may be used to remove the anti-reflective coating. Additional steps or removing the resist film and remaining anti-reflective coating may be employed to produce a device having the desired architecture.

The ARC coating compositions can be cured at lower temperatures and they produce coatings that can be removed by stripping solutions. It has been found that the antireflective coatings produced herein have better solvent (e.g. PGMEA) and TMAH resistance.

The following examples are included to demonstrate embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

In the following examples MA represents a methacryloxypropyl group, Vi represents a vinyl group, Ph represents a phenyl group and Me represents a methyl group Example 1

PGMEA (300 grams), phenyltrimethoxysilane (4.96 g, 0.025 mole), 3-methacryloxypropyltrimethoxysilane (18.63 g, 0.075 mol), methyltriethoxylsilane (13.37 g, 0.075 mole), triethoxylsilane (12.32 g, 0.075 mole), ethanol (30 g) and DI water (18 g, 1 mole) were loaded into a three-neck flask under nitrogen. Next, nitric acid (70%, 0.11 g) was added to the solution. The mixture was heated while stirring at 80° C. for 4 h, followed by refluxing for 4 hrs, during which about 120 g of volatiles were removed. The solution was then cooled to room temperature to yield a clear light yellow solution (pH≈4) at 10 wt %. The solution was filtered through a 0.20 micron PTFE filter. GPC results: Mw=53,500; $M_w/M_n$=22.21. The resulting resin has a theoretical formula of

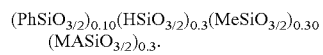
    $(MASiO_{3/2})_{0.3}$.

Example 2

A PGMEA solution (10 wt. %, 10 g) of the resin produced in Example 1 was mixed with benzoyl peroxide (0.01 g dissolved in 2 g of PGMEA). The material was spin-coated on a 4" silicon wafer, which is then cured at 250° C. for 1 min. The physical and optical properties of the wafer were then measured. Film thickness=1726 Å, Si %=27.3%.

Example 3

PGMEA (300 grams), phenyltrimethoxysilane (4.96 g, 0.025 mole), 3-methacryloxypropyltrimethoxysilane (6.21 g, 0.025 mol), methyltriethoxylsilane (22.29 g, 0.125 mole), triethoxylsilane (12.32 g, 0.075 mole), ethanol (30 g) and DI water (18 g, 1 mole) were loaded into a three-necked flask under nitrogen. Next, nitric acid (70%, 0.11 g) was added to the solution. The mixture was heated while stirring at 80° C. for 4 h, followed by refluxing for 4 hrs, during which about 120 g of volatiles were removed. The solution was then cooled to room temperature to yield a clear light yellow solution (pH≈4) at 10 wt %. The solution was filtered through a 0.20 micron PTFE filter. GPC results: Mw=2080; Mw/Mn=174. The resin had a theoretical formula of $$(PhSiO_{3/2})_{0.10}(HSiO_{3/2})_{0.3}(MeSiO_{3/2})_{0.50}(MASiO_{3/2})_{0.1}.$$

Example 4

A PGMEA solution (10 wt. %, 10 g) of the resin produced in Example 3 was mixed with benzoyl peroxide (0.01 g dissolved in 2 g of PGMEA). The material was spin-coated on a 4" silicon wafer, which is then cured at 250° C. for 1 min. The wet removal rate after cure was 100% by NE-98.

Example 5

120 g of propylene glycol methyl ether acetate (PGMEA, 120 g), phenyltrichlorosilane (5.29 g, 0.025 mole), methyltrichlorosilane (18.69 g, 0.125 mol), vinyltrichlorosilane (4.04 g, 0.025 mole), and trichlorosilane (10.16 g, 0.075 mole) were added to a three-necked flask at 20° C. under a nitrogen atmosphere. In a separate flask, PGMEA (350 g) and water (12.96 g, 0.72 mole) were added and mixed; the homogenous water/PGMEA solution was then added to the three-necked flask over 90 minutes. After the addition the reaction flask was allowed to body for two hours. The solution was transferred to a 1 L separation funnel, and washed with DI water twice (2×100 g) without mixing (pH=1 after two washes). The water portion is at the bottom and is drained after each wash. The solution was then transferred to a 1 L pear flask. About 40 g of EtOH was added. The solution was stripped to 10 wt % solution by rot-vap. The result 10% PGMEA solution was bottled for testing after filtered through a 0.2 mm Teflon filter. GPC results (vs. PS): Mw=10,400, Mw/Mn=3.97. The resin had a theoretical formula of $$(PhSiO_{3/2})_{0.10}(HSiO_{3/2})_{0.3}(MeSiO_{3/2})_{0.50}(MASiO_{3/2})_{0.1}$$

Example 6

A PGMEA solution (10 wt. %, 10 g) of the resin produced in Example 5 was mixed with benzoyl peroxide (0.01 g dissolved in 2 g of PGMEA). The material was spin-coated on a 4" silicon wafer, which is then cured at 250° C. for 1 min. The wet removal rate after cure was 100% by NE-98.

Example 7

PGMEA (300 grams), phenyltrimethoxysilane (4.96 g, 0025 mole), (3-glycidoxypropyl)trimethoxysilane (5.90 g, 0.025 mol), methyltriethoxylsilane (22.29 g, 0.125 mole), triethoxylsilane (12.32 g, 0.075 mole), and DI water (18 g, 1 mole) were loaded into a three-necked flask under nitrogen. Next, nitric acid (70%, 0.05 g) was added to the solution. The mixture was heated while stirring at 80° C. for 2 h, followed by refluxing for 4 hrs, during which about 120 g of volatiles were removed. The solution was then cooled to room temperature to yield a clear light solution at 10 wt %. The solution was filtered through a 0.20 micron PTFE filter. GPC results: Mw=4950; Mw/Mn=2.78. The resin had a theoretical formula of $$(PhSiO_{3/2})_{0.10}(HSiO_{3/2})_{0.3}(MeSiO_{3/2})_{0.50}(MASiO_{3/2})_{0.1}.$$

Example 8

A PGMEA solution (10 wt. %, 10 g) of the resin produced in Example 7 was mixed with 0.01 g of TAG-2168 (in 2 g of PGMEA), which contains blocked dodecylbenzene sulfonic acid in PGMEA as a thermal acid generator, from King industries at Norwalk, Conn. 06852. The material was spin-coated on a 4" silicon wafer, which was then cured at 250° C. for 1 min. The wet removal rate after cure was 100% by NE-98.

Example 9

A PGMEA solution (10 wt. %, 10 g) of the resin produced in Example 7 was mixed with 0.01 g of IRGACURE 379 (in 2 g of PGMEA), which is a blocked tertiary amine, from Ciba specialty chemicals. The material was spin-coated on a 4" silicon wafer, which is then cured at 250° C. for 1 min. The wet removal rate after cure was 100% by NE-98.

Film Coating and Characterization

The film coating on wafers was processed on a Karl Suss CT62 spin coater. The resin PGMEA solution was first filtered through a 0.2 mm TEFLON filter and then spin coated onto standard single side four inch polished low resistivity wafers or double sided polished FTIR wafers (spin speed=2000 rpm; acceleration speed=5000, time=20 seconds). Films were cured at a temperature (200-250° C.) for 90 seconds as indicated in the tables using a rapid thermal processing (RTP) oven with a nitrogen gas purge. The film thickness, refractive index and k value were determined using a J. A. Woollam ellipsometer. The thickness values recorded were the average of nine measurements. PGMEA resistance after cure was determined by measuring the film thickness change before and after PGMEA rinse. The wet removal rate was assessed with two commercial wet stripping solution NE89 and CC1. Contact angle measurements using water and methylene iodide as liquids were used to calculate the critical surface tension of wetting using the Zisman approach. Results are summarized in Table 1, 2 and 3.

TABLE 1

Cure Properties of Methacrylate Functional Silsesquioxane Resin (Example 1) and its blend with free radical initiators.

| Example | Free Radical Initiator[1] | Bake T, ° C. | Th, Å | ΔTh, Å PGMEA | ΔTh, Å TMAH |
|---|---|---|---|---|---|
| A-1 | None | 200 | 2156 | 253 | |
| | | 200 | 2160 | | 29 |
| | | 250 | 2147 | 53 | |
| | | 250 | 2173 | | 23 |
| A-2 | BPO | 200 | 2166 | 71 | |
| | | 200 | 2152 | | 21 |
| | | 250 | 1726 | 13 | |
| | | 250 | 1733 | | 17 |
| A-3 | DCP | 250 | 2161 | 22 | |
| | | 250 | 2193 | | 20 |
| A-4 | LUP | 250 | 2160 | 23 | |
| | | 250 | 2158 | | 22 |

[1]BPO = benzoyl peroxide; DCP = dicumyl peroxide; LUP = Lupersol 101

TABLE 2

Cure Properties of Methacrylate Functional Silsesquioxane Resin (Example 3) and its blend with free radical initiators

| Example | Free Radical Initiator[1] | Bake T, °C. | Th, Å | ΔTh, Å PGMEA | ΔTh, Å TMAH |
|---|---|---|---|---|---|
| A-5 | None | 200 | 1520 | 370 | |
|  |  | 200 | 1531 |  | 55 |
|  |  | 250 | 1265 | 59 | |
|  |  | 250 | 1285 |  | 44 |
| A-6 | BPO | 200 | 1516 | 111 | |
|  |  | 200 | 1513 |  | 48 |
|  |  | 250 | 1369 | 20 | |
|  |  | 250 | 1358 |  | 30 |
| A-7 | DCP | 250 | 1334 | 36 | |
|  |  | 250 | 1301 |  | 19 |

[1]BPO = benzoyl peroxide; DCP = dicumyl peroxide; LUP = Lupersol 101

TABLE 3

Cure Properties of Vinyl Functional Silsesquioxane Resin (Example 4) and its blend with free radical initiators

| Example | Free Radical Initiator[1] | Bake T, °C. | Th, Å | ΔTh, Å PGMEA | ΔTh, Å TMAH |
|---|---|---|---|---|---|
| A-8 | None | 200 | 1687 | 384 | |
|  |  | 200 | 1681 |  | 35 |
|  |  | 250 | 1676 | 29 | |
|  |  | 250 | 1654 |  | 11 |
| A-9 | AIBN | 200 | 1689 | 167 | |
|  |  | 200 | 1696 |  | 10 |
| A-10 | DCP | 250 | 1654 | 0 | |
|  |  | 250 | 1689 |  | 7 |
| A-11 | LUP | 250 | 1334 | 66 | |
|  |  | 250 | 1301 |  | 33 |

[1]AIBN = Azobisisobutyronitrile; DCP = dicumyl peroxide; LUP = Lupersol 101

TABLE 4

Cure Properties of Epoxy Functional Silsesquioxane Resin (Example 7) and its blend with thermal acid and base generators

| Example | Additive[1] | Bake T, °C. | Th, Å | ΔTh, Å PGMEA | ΔTh, Å TMAH |
|---|---|---|---|---|---|
| A-12 | None | 250 | 2167 | 35 | 40 |
|  |  | 250 | 2169 |  |  |
| A-13 | TAG-2168 (TAG) | 250 | 2170 | 5 | |
|  |  | 250 | 2165 |  | 12 |
| A-14 | IRGACURE 379 (TBG) | 250 | 2135 | 2 | |
|  |  | 250 | 2142 |  | 6 |

[1]TAG = thermal acid generator; TBG = thermal base generator.

What is claimed is:

1. A method of forming an antireflective coating on an electronic device comprising
   (A) applying to an electronic device an antireflective coating composition comprising
      (i) silsesquioxane resin having the formula
      $$(PhSiO_{(3-x)/2}(OR')_x)_m(HSiO_{(3-x)/2}(OR')_x)_n(MeSiO_{(3-x)/2}(OR')_x)_o(RSiO_{(3-x)/2}(OR')_x)_p$$
      where Ph is a phenyl group Me is a methyl group, R is selected from a reactive organic functional group or curable group selected from an acrylate group, an alkenyl group, an epoxy group, and combinations thereof, R' is hydrogen or a hydrocarbon group, x has a value of 0, 1 or 2; m has a value of 0.01 to 0.97, n has a value of 0.01 to 0.97, o has a value of 0.01 to 0.97, p has a value of 0.05 to 0.95, and m+n+o+p≈1; and
      (ii) a solvent, and
   (B) removing the solvent and curing the silsesquioxane resin to form an antireflective coating on the electronic device.

2. The method as claimed in claim 1 wherein the antireflective coating composition additionally contains a free radical initiator.

3. The method as claimed in claim 2 wherein the antireflective coating composition additionally contains an additive selected from photo-acid generators, thermal-acid generators, photo-base or thermal-base generators.

4. The method as claimed in claim 2 wherein the antireflective coating composition is applied by spin coating.

5. The method as claimed in claim 2 wherein the silsesquioxane resin is cured by heating.

6. The method as claimed in claim 5 wherein the silsesquioxane resin is cured by heating at 80° C. to 450° C. for 0.1 to 60 minutes.

7. The method as claimed in claim 1 wherein the silsesquioxane resin is cured by ultraviolet light.

* * * * *